(12) United States Patent
Nakayama et al.

(10) Patent No.: US 7,605,392 B2
(45) Date of Patent: Oct. 20, 2009

(54) FIELD EFFECT TRANSISTOR AND PRODUCTION PROCESS THEREOF

(75) Inventors: Tomonari Nakayama, Yokohama (JP); Toshinobu Ohnishi, Yokohama (JP); Makoto Kubota, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 355 days.

(21) Appl. No.: 10/559,799

(22) PCT Filed: Jun. 9, 2005

(86) PCT No.: PCT/JP2005/010995

§ 371 (c)(1),
(2), (4) Date: Dec. 8, 2005

(87) PCT Pub. No.: WO2005/122279

PCT Pub. Date: Dec. 22, 2005

(65) Prior Publication Data

US 2007/0096079 A1    May 3, 2007

(30) Foreign Application Priority Data

Jun. 14, 2004    (JP) .............................. 2004-176130

(51) Int. Cl.
*H01L 29/08* (2006.01)
(52) U.S. Cl. .......................................... 257/40; 438/99
(58) Field of Classification Search ................... 257/40; 438/99
See application file for complete search history.

(56) References Cited

U.S. PATENT DOCUMENTS 3,857,817 A * 12/1974 Henshaw et al. ............ 528/254

(Continued)

FOREIGN PATENT DOCUMENTS

JP    10-190001    7/1998

(Continued)

OTHER PUBLICATIONS

R. Mlica et al, "membranes containing new large size calixarenes on semiconductopr substrates for chemical microsensors", Mar. 27, 1997, Analytica Chimica Acta (1997), 354 (1-3) 283-289 CODEN: ACACAM; ISSN 0003-2670, first page and pp. 248-289. First page and pp. 284-289 are attached.*

(Continued)

*Primary Examiner*—Wai-Sing Louie
*Assistant Examiner*—Bilkis Jahan
(74) *Attorney, Agent, or Firm*—Fitzpatrick, Cella, Harper & Scinto

(57) ABSTRACT

There is provided a field effect transistor including a substrate, an organic semiconductor layer 6, an insulating layer 3, and a conductive layers 2, 4, and 5, wherein the insulating layer 3 comprises a cured product of a phenol resin represented by the following general formula (1):

$$\text{(1)}$$

($R^1$, $R^2$ and $R^3$ each represent hydrogen atom, halogen atom, hydroxymethyl group, alkyl group having 1 to 12 carbon atoms, alkenyl group, alkinyl group, alkoxyl group, alkylthio group, or alkyl ester group, $X^1$ and $X^2$ each represent hydrogen atom, alkyl group having 1 to 12 carbon atoms, alkenyl group, alkinyl group, or aryl group, and n represents an integer of 0 to 2,000.) According to the present invention, a field effect transistor capable of smoothening the gate electrode having a low surface smoothness, in which a current leak to the gate electrode is small can be obtained.

7 Claims, 2 Drawing Sheets

U.S. PATENT DOCUMENTS

| | | | |
|---|---|---|---|
| 6,107,117 | A | 8/2000 | Bao et al. .................... 438/99 |
| 6,586,791 | B1 * | 7/2003 | Lee et al. .................... 257/295 |
| 6,861,377 | B1 | 3/2005 | Hirai et al. .................. 438/781 |
| 7,026,231 | B2 | 4/2006 | Kubota et al. ............... 438/586 |
| 7,094,625 | B2 | 8/2006 | Miura et al. .................. 438/99 |
| 7,239,081 | B2 * | 7/2007 | Tsutsui ....................... 313/503 |
| 2004/0026689 | A1 * | 2/2004 | Bernds et al. ................. 257/40 |
| 2004/0075383 | A1 * | 4/2004 | Endo et al. .................. 313/506 |
| 2004/0118520 | A1 | 6/2004 | Nakayama et al. ..... 156/345.41 |
| 2004/0129937 | A1 * | 7/2004 | Hirai ........................... 257/40 |
| 2004/0131782 | A1 | 7/2004 | Hasei et al. .................. 427/337 |
| 2005/0001210 | A1 * | 1/2005 | Lee et al. ..................... 257/40 |
| 2005/0202348 | A1 * | 9/2005 | Nakayama et al. ........... 430/311 |
| 2005/0205861 | A1 * | 9/2005 | Bao et al. ..................... 257/40 |
| 2006/0081880 | A1 | 4/2006 | Miyazaki et al. ............. 257/200 |
| 2006/0113523 | A1 | 6/2006 | Kubota et al. ................. 257/40 |
| 2006/0145141 | A1 | 7/2006 | Miura et al. .................. 257/40 |
| 2006/0214159 | A1 | 9/2006 | Nakayama et al. ............ 257/40 |

FOREIGN PATENT DOCUMENTS

| | | |
|---|---|---|
| JP | 2004-6700 | 1/2004 |
| JP | 2004-63975 | 2/2004 |
| JP | 2004-63977 | 2/2004 |
| JP | 2004-128469 | 4/2004 |
| JP | 2004-146796 | 5/2004 |

OTHER PUBLICATIONS

A. Assadi, et al., "Field-effect mobility of poly(3-hexylthiophene)", Appl. Phys. Lett., vol. 53, No. 3, Jul. 18, 1988, pp. 195-197.

Zhenan Bao, et al., "High-Performance Plastic Transistors Fabricated by Printing Techniques", Chem. Mater., vol. 9, No. 6, 1997, pp. 1299-1301.

H. Fuchigami, et al., "Polythienylenevinylene thin-film transistor with high carrier mobility", Appl. Phys. Lett., vol. 63, No. 10, Sep. 6, 1993, pp. 1372-1374.

Janos Veres, et al., "Low-$k$ Insulators as the Choice of Dielectrics in Organic Field-Effect Transistors", Advanced Functional Materials, vol. 13, No. 3, Mar. 2003, pp. 199-204.

Tatsuya Shimoda, et al., "Organic transistor fabricated by ink-jet printing", Appl. Phys. Lett., vol. 70, 2001, pp. 1452-1456. (with partial translation).

Tatsuya Shimoda, et al., "Organic transistor fabricated by ink-jet printing", Oyo Buturi, vol. 70, No. 12, 2001, pp. 1452-1456. (with partial translation).

* cited by examiner

FIELD EFFECT TRANSISTOR AND PRODUCTION PROCESS THEREOF

TECHNICAL FIELD

The present invention relates to a field effect transistor and a production process thereof and, more specifically, to a field effect transistor in which a leak current to a gate electrode is small even when a gate electrode having low surface smoothness such as an ITO electrode formed on a resin substrate or an electrode formed by coating is used as the above gate electrode and to a production process thereof.

BACKGROUND ART

IC technology making use of an organic semiconductor device has been attracting much attention. The main advantages of the organic semiconductor device resides in that it can be produced at a low cost and that a flexible resin can be used as a substrate. Owing to these advantages, the organic semiconductor device is expected to be used in circuits comprising a plastic substrate, display drive circuits for electronic tags and displays, and memories.

In general, the organic semiconductor device is composed of a substrate, insulating layer, electrode, and organic semiconductor layer. Particularly, a device composed of a gate insulating layer, gate electrode, source electrode, drain electrode, and organic semiconductor layer is used as a thin film field effect transistor (FET).

In an FET device including an organic semiconductor as a semiconductor layer, when voltage (gate voltage, Vg) applied to the gate electrode is changed, the amount of charge at the interface between the gate insulating layer and the organic semiconductor layer becomes too large or too small. As a result, a source/drain current (Id) flowing from the source electrode to the drain electrode through the organic semiconductor varies, thereby making switching possible. Therefore, the FET device fulfills a device function.

In fact, a high-performance organic semiconductor device has been obtained by applying a solution of an organic semiconductor compound such as polyalkylthiophene compound or polythienylenevinylene compound (refer to Assadi A., et al., "Field-effect mobility of poly(3-hexylthiophene)", Appl. Phys. Lett., vol. 53, pp. 195 (1988), Fuchigami H., et al., "Polythienylenevinylene thin-film transistor with high carrier mobility", Appl. Phys. Lett., vol. 63, pp. 1372 (1993), and Japanese Patent Application Laid-Open No. H10-190001).

However, when a flexible resin substrate is used, it is greatly inferior to a silicon or glass substrate in smoothness and flatness. In addition, when electrodes are formed by an inexpensive printing method, they are greatly inferior in surface smoothness and flatness. Therefore, when the insulation properties of the gate insulating layer are unsatisfactory, a leak current from the source electrode to the drain electrode becomes large.

When an organic semiconductor device is provided on a flexible resin substrate, constituents such as a gate insulating layer and organic semiconductor layer on the substrate must be produced at low temperatures of 200° C. or less. The reason for this is that when a device provided on a resin substrate is exposed to a high-temperature atmosphere, the resin substrate is softened or deteriorated.

For example, Shimoda et al. fabricated an FET including an insulating layer made of polyvinyl phenol (PVP) and electrodes and an organic semiconductor layer all of which were formed by ink jet printing (refer to Shimoda, et al., "Organic Transistor Manufactured by Ink Jet Printing", Oyo Buturi, vol. 70, pp. 1452 (2001)). Meanwhile, Veres.B. J., et al. fabricated an FET including an organic semiconductor layer made of polytriallylamine formed on an insulating layer having a low dielectric constant (refer to Veres B. J., et al., "Low-k insulator as the choice of dielectrics in organic field-effect transistors", vol. 13, pp. 199 (2003)). Since a thermoplastic resin is used as a material for forming the insulating layer in both of the above prior arts, the obtained FET's have high processability but involve problems with solvent resistance and heat stability. Therefore, they are not suitable for forming multiple layers and it has been difficult to form a thin layer showing sufficiently high insulating properties.

Although an FET including an insulating layer made of polyimide which is generally known to have high insulating properties has been reported, when an attempt is made to form a polyimide insulating layer from a precursor, high temperatures of 250° C. or more is required and it is therefore difficult to form an FET on a resin substrate.

Meanwhile, Z. Bao., et al. fabricated an FET by coating a polyimide insulating layer formed by baking at a low-temperature, a π-conjugated polymer active layer made of regioregular poly(3-hexylthiophene), and a source/drain electrode layer formed from an aqueous dispersion of a conductive polymer sequentially on a polyethylene terephthalate (PET) sheet having an indium tin oxide (ITO) gate electrode and drying them (refer to Z. Bao, Y. Feng, A. Dodabalapur, V. R. Raju, and A. J. Lovinger, "Chem. Mater." 9, 1299 (1997)). Since it is considered that the surface of an ITO film formed on PET like the gate electrode used in the above prior art has low smoothness and the polyimide film formed by baking at a low temperature has low density, it has been difficult to form an insulating layer.

All of the above insulating layers do not show high insulating properties on a plastic substrate or an electrode having low smoothness and high mobility when an FET is formed.

DISCLOSURE OF THE INVENTION

To produce a field effect transistor including an organic semiconductor by an inexpensive process as described above, when a gate electrode is formed by coating, the insulating properties of the gate insulating layer are deteriorated by irregularities on the electrode. To solve this problem, the thickness of the insulating layer must be large but this causes increase in gate voltage. As a result, a gate insulating layer material having a high dielectric constant but low surface smoothness and low insulating properties which is not suitable for a wet process such as printing must be used to form an insulating layer.

It is an object of the present invention which has been made in view of the above background art to provide a field effect transistor in which an organic resin material capable of flattening the surface of the electrode is used in an insulating layer, whereby a current leak from a gate electrode to a source electrode or drain electrode is small even when a gate electrode having low surface smoothness is used as the above gate electrode.

The present invention provides a field effect transistor including at least a substrate, an organic semiconductor layer, an insulating layer, and a conductive layer, wherein the insulating layer comprises a cured product of a phenol resin represented by the following general formula (1):

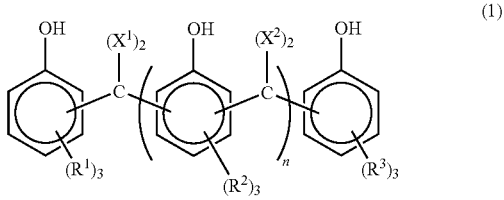

(1)

(wherein, $R^1$, $R^2$ and $R^3$ are each independently at least one selected from the group consisting of hydrogen atom, halogen atom, hydroxymethyl group, alkyl group having 1 to 12 carbon atoms, alkenyl group, alkinyl group, alkoxyl group, alkylthio group, and alkyl ester group, $X^1$ and $X^2$ are each independently at least one selected from the group consisting of hydrogen atom, alkyl group having 1 to 12 carbon atoms, alkenyl group, alkinyl group, and aryl group, and n is an integer of 0 to 2,000.).

It is preferable that the conductive layer include a gate electrode, a source electrode, and a drain electrode, the insulating layer includes a gate insulating layer, and the gate insulating layer comprises a cured product of a phenol resin represented by the above general formula (1).

It is further preferable that the thickness of the gate insulating layer be 100 nm to 1 µm.

It is further preferable that part or all of the conducive layer comprises an agglomerate of conductive fine particles having a particle diameter of 5 nm to 2 µm.

The present invention provides a process for producing a field effect transistor including at least a substrate, an organic semiconductor layer, an insulating layer, and a conductive layer, the process including the steps of coating a thermosetting resin composition containing at least a phenol resin represented by the above general formula (1) and heating it to form an insulating layer.

It is preferable that part or all of the conductive layer be formed by applying a solution, dispersion or paste of a conductive material or a precursor of the conductive material and heating it.

It is further preferable that the softening point of the phenol resin contained in the thermosetting resin composition be in the range of 70 to 130° C.

The present invention can provide a field effect transistor in which even when an electrode having low surface smoothness is used as the gate electrode, an insulating layer capable of smoothening the surface of the electrode and having high insulating properties is formed on the gate electrode, whereby a current leak from a gate electrode to a source electrode or a drain electrode is small and which shows high mobility without increasing drive voltage.

The present invention can also provide a process for producing a field effect transistor, capable of obtaining the above field effect transistor easily.

BEST MODE FOR CARRYING OUT THE INVENTION

The field effect transistor (to be abbreviated as "FET" hereinafter) of the present invention is a device having at least an organic semiconductor, insulator, and conductor. The insulator is an insulating film (layer) for covering the conductor as an electrode. The organic semiconductor is an organic semiconductor layer which responds to a stimulus (electric field) generated by the conductor (electrode). Specifically, it is a layer whose electric properties are changed by an electric field. More specifically, it is a layer whose conductivity, that is, a current flowing in the organic semiconductor layer changes according to a variation in electric field.

The insulating layer is intended not only to electrically insulate the electrode from the organic semiconductor layer but also to induce positive or negative charge at the interface with the organic semiconductor layer when the electrode as the conductor controls the electric properties of the organic semiconductor layer.

The FET of the present invention may have a source electrode and a drain electrode in addition to the above three constituents. In this case, the above conductor may be used as a gate electrode. The above insulating layer may be used as a gate insulating layer for covering the gate electrode so as to insulate the gate electrode from the organic semiconductor layer, source electrode, and drain electrode.

Figure 1:
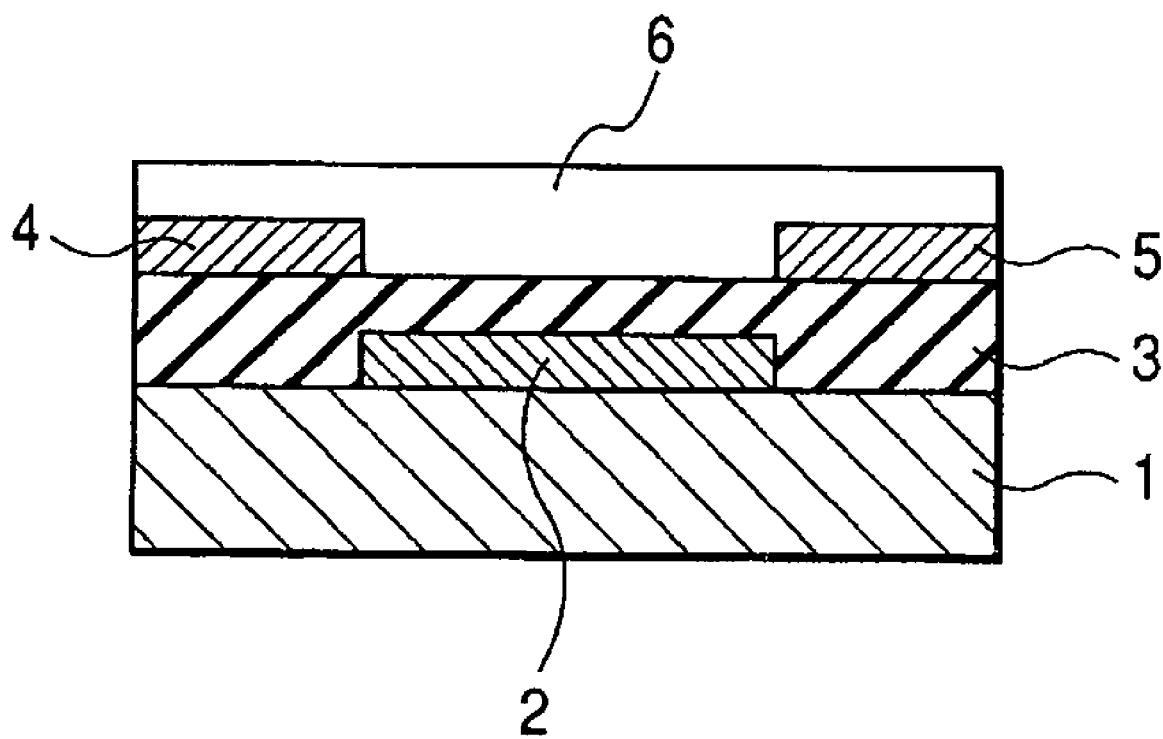
FIG. 1 is a schematic sectional view of an example of the FET of the present invention.

FIG. 1 is a schematic sectional view of an organic semiconductor device as the FET of the present invention. Reference numeral 1 denotes a substrate, 2 a gate electrode, 3 a gate insulating layer, 4 a source electrode, 5 a drain electrode, and 6 an organic semiconductor layer. In this device, the gate electrode 2 is formed on the surface of the substrate 1, the gate insulating layer 3 is formed on the gate electrode 2, and the source electrode 4 and the drain electrode 5 are formed on the surface of the gate insulating layer 3 with a space therebetween. The organic semiconductor layer 6 is formed on the source electrode 4, the drain electrode 5 and the gate insulating layer 3, the space between these electrodes, in contact with the both electrodes 4 and 5. The gate insulating layer 3 is formed to cover the gate electrode 2.

The insulating layer of the present invention is intended not only to electrically insulate the electrode from the organic semiconductor layer but also to induce positive or negative charge at the interface with the organic semiconductor layer when the electrode as the conductor controls the electric properties of the organic semiconductor layer. Therefore, the interface between the insulating layer and the organic semiconductor must be uniform. Consequently, the inventors have conducted intensive studies to find a material capable of forming a thin insulating layer having an even surface easily on an uneven electrode formed on a resin substrate and have found that a cured product of a specific organic resin material is preferred.

The cured product of an organic resin preferred as the insulating layer of the present invention is a cured product of a phenol resin represented by the following general formula (1):

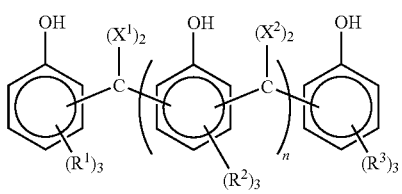

(1)

Wherein, $R^1$, $R^2$ and $R^3$ are each independently at least one selected from the group consisting of hydrogen atom, halogen atom, hydroxymethyl group, alkyl group having 1 to 12 carbon atoms, alkenyl group, alkinyl group, alkoxyl group, alkylthio group, and alkyl ester group.

$X^1$ and $X^2$ are each independently at least one selected from the group consisting of hydrogen atom, alkyl group having 1 to 12 carbon atoms, alkenyl group, alkinyl group, and aryl group, and n is an integer of 0 to 2,000, preferably 1 to 500.

Examples of the phenol resin represented by the above general formula (1) used in the present invention include: novolac resins such as phenol novolac resin, o-cresol novolac resin, bisphenol A novolac resin, and cophenolic novolac resin obtained by using a plurality of phenolic components; resol type phenol resins having a reactive crosslinking group such as methylol group or dimethylol group; and dibenzyl ether type phenol resins. Modified phenol resins obtained by modifying a novolac resin with oil may also be used. Out of these, novolac resins are preferred because they have high film strength after baking.

The softening point of the phenol resin used in the present invention is 70 to 130° C., preferably 80 to 120° C. When the softening point is lower than 70° C., the strength of the film after curing becomes unsatisfactory and when the softening point is higher than 130° C., the resin does not reflow fully at the time of thermal curing, thereby making it impossible to smoothen the uneven surface of the electrode.

The strength of the film after curing can be improved by using a crosslinking agent in conjunction with the phenol resin.

The FET production process of the present invention includes the steps of applying a thermosetting resin composition including a phenol resin represented by the above general formula (1) and heating it to form an insulating layer.

The above thermosetting resin composition includes a phenol resin represented by the above general formula (1), crosslinking agent, and catalyst, solvent.

The amount of the phenol resin represented by the general formula (1) contained in the above thermosetting resin composition is 0.5 to 50 wt %, preferably 1 to 40 wt %.

Examples of a crosslinking agent used in combination with the phenol resin include: a bi- or more functional epoxy compound; an oxetane compound; an isocyanate compound; a methylol compound; an acetylated methylol compound; a melamine cross linking agent; and a substituted urea-based crosslinking agent. Of those, crosslinking agents are preferably a melamine crosslinking agent and substituted urea. Examples of thereof include a methoxymethylated glycoluryl, a methoxymethylated melamine, and a methyloled melamine. Particularly preferred is tetramethoxymethyl glycoluryl or hexamethoxymethyl melamine.

The amount of the above crosslinking agent is 10 to 200 parts by weight based on 100 parts by weigh of the above phenol resin. When the amount of the crosslinking agent is smaller than 10 parts by weight, the curing time becomes too long and when the amount is larger than 200 parts by weight, the number of unreacted crosslinked portions becomes too large, thereby making it impossible to retain the characteristic properties of the film. When at least one of $R^1$, $R^2$ and $R^3$ of the phenol resin represented by the general formula (1) is a reactive crosslinking group such as hydroxymethyl group, a fully cured film is obtained without using a crosslinking agent in conjunction with the phenol resin.

To crosslink the above resin with the above crosslinking agent efficiently, a catalyst may be used in combination.

The catalyst used in conjunction with the phenol resin may be selected from acid catalyst, basic catalyst, and quaternary onium salt according to the crosslinking agent in use. For example, when hexamethoxymethyl melamine is used as a crosslinking agent, a carboxylic acid such as formic acid, acetic acid, or oxalic acid, or sulfonic acid such as p-toluenesulfonic acid or camphorsulfonic acid may be used as the acid catalyst. Preferably, a sulfonic acid such as p-toluenesulfonic acid or camphorsulfonic acid is used. An amine sulfonate may be used to improve stability in a solution and flattening ability by reducing the curing rate. Examples of the amine sulfonate include p-toluene sulfonic acid pyridinium salts.

The amount of the above catalyst is 0.1 to 10 parts by weight based on 100 parts by weight of the total of the above phenol resin and the above crosslinking agent. When the amount of the catalyst is smaller than 0.1 part by weight, curing becomes incomplete with the result of deteriorated solvent resistance and film strength and when the amount is larger than 10 parts by weight, the water absorptivity of the film rises, thereby making it impossible to retain the characteristic properties of the film.

Solvents dissolving the resin and the like can be used such as ethylene glycol monomethyl ether, methyl cellosolve acetate, diethylene glycol monomethyl ether, propylene glycol, propylene glycol monomethyl ether, propylene glycol monomethyl ether acetate, toluene, xylene, methyl ethyl ketone, cyclohexanone, 2-hydroxypropionic acid ethyl, butyl acetate, ethyl lactate, and butyl lactate. Those organic solvents can be employed independently or in combination with two or more.

Of the solvents, it is prepferable that propylene glycol monomethyl ether, propylene glycol monomethyl ether acetate, ethyl lactate, butyl lactate, and cyclohexanone be used from the view of leveling properties.

The solid content of the thermosetting resin composition in the present invention can be arbitrarily adjusted according to a desired film thickness but preferably 1 to 50 wt %.

The technique for applying the thermosetting resin composition in the present invention is spin casting, dipping, dropping, off-set, screen printing, ink jet printing, or spray coating. It is important that dust should not be contained as much as possible to maintain the smoothness of the obtained film, and it is desired that the composition should be filtered with a membrane filter in advance.

The heating temperature for curing the thermosetting resin composition of the present invention is preferably 100 to 220° C. The uneven surface of the substrate can be flattened and the surface of the coating film of the thermosetting resin composition can be made even by reflowing during the time from heating to curing. When the curing temperature is lower than 100° C., curing becomes incomplete, thereby making it impossible to obtain a film having a high thermal deformation temperature after curing and high strength. When the curing temperature is higher than 220° C., a sufficiently long curing time cannot be obtained due to drastic heating and the uneven surface of the substrate cannot be flattened. Although there are various heating means, a hot air circulating oven, hot plate, and infrared lamp may be used.

To improve the wettability and adhesion of the solution to the substrate and electrode, a surfactant or coupling agent may be added as long as electric properties such as insulating properties are not impaired.

When the insulating layer in the present invention is used as the gate insulating layer 3, the thickness of the film is in the range of 100 nm to 1 μm and changed according to the surface condition of the gate electrode in use. When the thickness of the film is smaller than 100 nm, it is difficult to form a fine layer on the electrode having low surface smoothness. When the thickness of the film is larger than 1 μm, a higher gate voltage must be applied to obtain a higher current from the FET. The thickness of the film is more preferably 150 to 800 nm.

The average surface roughness (Ra) of the insulating layer in the present invention is 5 nm or less, preferably 0.1 to 3 nm. The average surface roughness is a value measured with a scanning probe microscope (SPI3800 of Seiko Instruments Co., Ltd.) and indicates the smoothness of the surface of the film.

A substrate 1 in the present invention can employ the substrate such as silicon, glass, a metal, and a resin processed in plate shape, foil shape, film shape, or sheet shape. Particularly, a resin substrate is preferable from the aspect of flexibility and processability. Materials of the resin substrate are used such as polyethylene terephthalate (PET), polyethylene naphthalate (PEN), polyimide (PI), polyetherimide (PEI), polyether sulfone (PES), polysulfone (PSF), polyphenylene sulfide (PPS), polyether ether ketone (PEEK), polyarylate (PAR), and polyamide imide (PAI). Another resin substrate includes: a polycycloolefin resin; an acrylate resin; polystyrene; ABS; a polyethylene; polypropylene; a polyamide resin; a polycarbonate resin; a polyphenylene ether resin; and a cellulose resin.

Materials due to form an electrode in the present invention are not particularly limited if the materials compose of electrical conductivity. The materials include: platinum; gold; silver; nickel; chrome; copper; iron; stannum; antimonial lead; tantalum; indium; aluminium; zinc; and magnesium, and alloy thereof; a conductive metallic oxide such as indium/tin oxide; and inorganic and organic semiconductors improved electric conductivity with doping or the like. The semiconductors include: single crystalline silicon; polysilicon; amorphous silicon; germanium; graphite; polyacetylene; polyparaphenylene; polythiophene; polypyrrole; polyaniline; polythienylenevinylene; and polyparaphenylene vinylene.

When the electrode is used as the source electrode 4 and the drain electrode 5, out of the electrode materials listed above, a material having low electric resistance on the contact surface with the semiconductor layer is preferred.

The method of fabricating the electrode is sputtering, vapor deposition, printing of a solution, dispersion or paste, or ink jet printing. It is preferred to use an agglomerate of conductive fine particles having a diameter of 5 nm to 2 μm formed by the printing of a solution, dispersion, or paste, or ink jet printing because a vacuum apparatus is not necessary.

Specifically, the electrode is formed from a dispersion or solution of a conductive polymer, slurry or paste containing metal fine particles, metal oxide, or carbon black, or a solution of an organic metal. Examples of the conductive polymer include poly(ethylenedioxythiophene)/poly(4-styrenesulfonic acid) and poly(p-aniline)/camphorsulfonic acid. Examples of the metal fine particles include nano-order fine particles of silver, gold, or nickel having a primary particle diameter of several tens of nm. Examples of the metal oxide include zinc oxide, titanium oxide, tin oxide, antimony oxide, indium oxide, bismuth oxide, tin doped indium oxide, antimony doped tin oxide, and zirconium oxide. Examples of the organic metal include silver organic salts. To disperse the fine particles uniformly, a surfactant or resin may be added in a small amount, or the surface of each particle may be modified by an organic molecule.

As for the shape of the agglomerate of conductive fine particles, conductive fine particles having a primary particle diameter of 5 nm to 2 μm are deposited in contact with one another. The fine particles may be fused together or densely deposited.

Most of the electrode materials formed by coating must be heated at a predetermined temperature to reduce their resistance, and the heating temperature is preferably 120 to 200° C. in consideration of use of the resin substrate. The film thickness of the electrode, which depends on the resistivity of the conductive material in use, is preferably 30 nm to 2 μm in consideration of jumping over a level difference at the time of deposition and sheet resistance.

The organic semiconductor layer 6 in the present invention is desirably made of a π-electron conjugated aromatic compound, chain compound, organic pigment, or organic silicon compound. Specific examples of the material of the organic semiconductor layer include: polyacenes such as pentacene, tetracene, and anthracene; and low molecular weight materials such as thiophene oligomer derivatives, phenylene derivatives, phthalocyanine compounds, porphyrin compounds, and cyanine coloring matter. High molecular weight materials such as polyacetylene derivatives, polythiophene derivatives, and polyphenylene vinylene derivatives may also be used. Any material may be used if it is a material for the organic semiconductor layer.

To align the above organic semiconductor layer 6 uniformly, the surface of the gate insulating layer 3, the source electrode 4, or the drain electrode 5 may be modified. For this modification, a dry process using ozone, plasma, or hexamethyldisilazane gas or a wet process using a solution of tetraalkoxysilane, trichlorosilane, and a surfactant dissolved in an organic solvent may be employed. The organic semiconductor layer 6 can be aligned uniformly by forming a very thin polymer film on the surface of the gate insulating layer or the surfaces of the both electrodes 4 and 5 if it does not become resistance when the both electrodes 4 and 5 come in contact with the organic semiconductor layer 6.

The structure of the field effect transistor in the present invention is not limited to a thin film structure and may be a solid structure.

EXAMPLES

The following examples are provided for the purpose of further illustrating the present invention but are in no way to be taken as limiting.

(Glass Substrate 1 having ITO Electrode)

A substrate obtained by forming an indium tin oxide (to be abbreviated as ITO hereinafter) film having a thickness of about 150 nm on a 0.7 μm-thick glass substrate was washed with acetone and isopropyl alcohol and dried. When the surface roughness of the substrate was measured with a scanning probe microscope (SPI3800 of Seiko Instruments Co., Ltd.), the surface roughness (Ra) of the resin substrate was 7 nm.

(Glass Substrate 2 having Silver Electrode)

A 1 mm-thick glass substrate was washed with acetone and isopropyl alcohol and dried. An organic silver compound (manufactured by Fujikura Kasei Co., Ltd., trade name of Dotite 9019) was applied to the surface of the substrate by dipping and baked in a hot air circulating oven set at 180° C. for 1 hour. A glass substrate 2 having a 300 nm-thick silver electrode was obtained. The surface roughness (Ra) of this resin substrate was 20 nm.

(Resin Substrate 3 having Silver Electrode)

An organic silver compound (manufactured by Fujikura Kasei Co., Ltd., trade name of Dotite 9019) was applied to the surface of a resin substrate having a 3 μm-thick flat layer formed on a 188 μm-thick PET substrate by dipping and baked in a hot air circulating oven set at 180° C. for 1 hour. A resin substrate 3 having a 300 nm-thick silver electrode was obtained. The surface roughness (Ra) of this resin substrate was 30 nm.

(Preparation of Thermosetting Resin Composition 1)

5.9 g of phenolic novolac resin (number average molecular weight of 770, molecular weight distribution of 1.5, softening point of 108° C.) and 4.1 g of hexamethoxymethyl melamine-based crosslinking agent (manufactured by Mitsui Cytec Co., Ltd., trade name of Cymel 303) were dissolved in a mixed solvent of 54 g of propylene glycol monomethyl ether acetate (to be abbreviated as PGMEA hereinafter) and 45.7 g of propylene glycol monomethyl ether (to be abbreviated as PGME hereinafter) completely at room temperature. 0.5 g of a 2-propanol solution of an acid catalyst (manufactured by Mitsui Cytec Co., Ltd., trade name of Catalyst 4040) was added to the obtained solution, and the resulting solution was filtered with a PTFE membrane filter having an opening size of 0.2 μm to prepare a thermosetting resin composition 1.

(Preparation of Thermosetting Resin Composition 2)

6.2 g of o-cresol novolac resin (number average molecular weight of 840, molecular weight distribution of 1.2, softening point of 97° C.). and 3.8 g of hexamethoxymethyl melamine-based crosslinking agent (manufactured by Mitsui Cytec Co., Ltd., trade name of Cymel 303) were dissolved in a mixed solvent of 54 g of PGMEA and 45.7 g of PGME completely at room temperature. The same operation as in Example 1 was then carried out to prepare a thermosetting resin composition 2.

(Preparation of Thermosetting Resin Composition 3)

6.84 g of the phenol novolac resin used in the thermosetting resin composition 1 and 5.16 g of tetramethoxy glycol urea-based crosslinking agent (manufactured by Mitsui Cytec Co., Ltd., trade name of Powder Link 1175) were dissolved in a mixed 25 solvent of 52.8 g of PGMEA and 34.8 g of PGME completely at room temperature. The same operation as in Example 1 was then carried out to prepare a thermosetting resin composition 3.

(Preparation of Thermosetting Resin Composition 4)

7.08 g of the o-cresol novolac resin used in the thermosetting resin composition 2 and 4.92 g of tetramethoxy glycol urea-based crosslinking agent (manufactured by Mitsui Cytec Co., Ltd., trade name of Powderlink 1175) were dissolved in a mixed solvent of 52.8 g of PGMEA and 34.8 g of PGME completely at room temperature. The same operation as in Example 1 was then carried out to prepare a thermosetting resin composition 4.

(Preparation of Thermosetting Resin Composition 5)

A thermosetting resin composition 5 was prepared by diluting 35.7 g of liquid resol (manufactured by Sumitomo Bakelite Co., Ltd., trade name of PC-25) with 63.3 g of PGME.

Example 1

The thermosetting resin composition 1 was applied to the glass substrate 1 having an ITO electrode by spin casting and heated at 180° C. in a hot air circulating oven for 1 hour to form a thermally cured layer of the organic resin. The thickness of the insulating layer (thermally cured layer) was about 250 nm. When the surface of the insulating layer was observed through an AFM, the surface roughness Ra of the layer was 1 nm or lower which was lower than the Ra (7 nm) of the ITO film.

Figure 2:
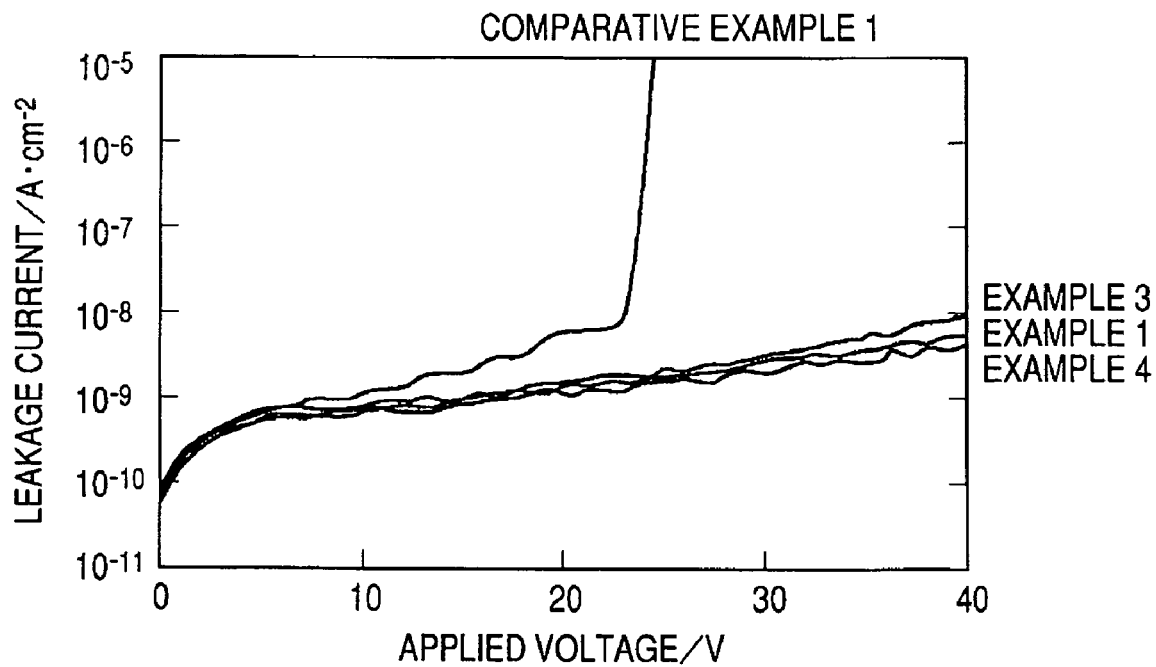
FIG. 2 is a diagram showing the insulating properties of devices including an insulating layer sandwiched between two electrode layers in Examples 1, 3 and 4 of the present invention and Comparative Example 1.

An upper electrode was formed from silver paste on the formed insulating layer and baked at 150° C. for 1 hour to measure its dielectric constant with an LCR meter. The dielectric constant was stable at a measurement range of 10 to 20 kHz and 4.0 at 1 kHz. The insulating properties of this insulating layer measured with a parameter analyzer (manufactured by Agilent Co., Ltd., trade name of 4156C) are shown in FIG. 2. The horizontal axis in FIG. 2 shows DC voltage applied to the cured film of the thermosetting resin composition 1 and the vertical axis shows a leak current value. According to this result, the obtained thin film of insulating layer showed high insulating properties at a voltage of 0 to 20 V.

Example 2

The thermosetting resin composition 1 was applied to the glass substrate 2 having a silver electrode by spin casting and heated at 180° C. in a hot air circulating oven for 1 hour to form a thermally cured layer of the organic resin. The thickness of the thin insulating layer (thermally cured layer) was about 300 nm. The Ra of the surface of the insulating layer was 3 nm or lower which was lower than the Ra (20 nm) of the surface of the silver electrode.

An upper electrode was formed from silver paste on the formed insulating layer and baked at 150° C. for 1 hour. The dielectric constant was stable at a measurement range of 10 to 20 kHz and 4.0 at 1 kHz. The obtained thin film insulating layer showed high insulating properties at a voltage of 0 to 20 V.

Example 3

The thermosetting resin composition 1 was applied to the resin substrate 3 having a silver electrode by spin casting and heated at 180° C. in a hot air circulating oven for 1 hour to form a thermally cured layer of the organic resin. The thickness of the insulating layer (thermally cured layer) was about 320 nm. The Ra of the surface of the insulating layer was 3 nm or lower which was lower than the Ra (30 nm) of the surface of the silver electrode.

An upper electrode was formed from silver paste on the formed insulating layer and baked at 150° C. for 1 hour. The dielectric constant was stable at a measurement range of 10 to 20 kHz and 4.0 at 1 kHz. The measured insulating properties of this insulating layer are shown in FIG. 2. The obtained thin film of insulating layer showed high insulating properties at a voltage of 0 to 20 V.

Example 4

The thermosetting resin composition 2 was applied to the glass substrate 1 having an ITO electrode by spin casting and heated at 180° C. in a hot air circulating oven for 1 hour to form a thermally cured layer of the organic resin. The thickness of the thin film (thermally cured layer) was about 240 nm. The Ra of the surface of the film was 1 nm or lower which was lower than the Ra (7 nm) of the ITO film.

An upper electrode was formed in the same manner as in Example 1 to evaluate its dielectric properties and insulating properties. The dielectric constant was stable at a measurement range of 10 to 20 kHz and 3.9 at 1 kHz. The measured insulating properties of this insulating layer are shown in FIG. 2. The obtained thin film of insulating layer showed high insulating properties at a voltage of 0 to 20 V.

Example 5

The thermosetting resin composition 3 was applied to the glass substrate 1 having an ITO electrode by spin casting and heated at 180° C. in a hot air circulating oven for 1 hour to form a thermally cured layer of the organic resin. The thickness of the thin film (thermally cured layer) was about 400 nm. The Ra of the surface of the film was 1 nm or lower which was lower than the Ra (7 nm) of the ITO film.

An upper electrode was formed in the same manner as in Example 1 to evaluate its dielectric properties and insulating properties. Its dielectric constant was stable at a measurement range of 10 to 20 kHz and about 5.0 at 1 kHz. The obtained thin film showed high insulating properties at a voltage of 0 to 20 V.

Example 6

The thermosetting resin composition 4 was applied to the glass substrate 1 having an ITO electrode by spin casting and heated at 180° C. in a hot air circulating oven for 1 hour to form a thermally cured layer of the organic resin. The thickness of the thin film (thermally cured layer) was about 400 nm. The Ra of the surface of the film was 1 nm or lower which was lower than the Ra (7 nm) of the ITO film.

An upper electrode was formed in the same manner as in Example 1 to evaluate its dielectric properties and insulating properties. Its dielectric constant was stable at a measurement range of 10 to 20 kHz and about 4.2 at 1 kHz. The obtained thin film showed high insulating properties at a voltage of 0 to 20 V.

Example 7

The thermosetting resin composition 4 was applied to the glass substrate 2 having a silver electrode by spin casting and heated at 180° C. in a hot air circulating oven for 1 hour to form a thermally cured layer of the organic resin. The thickness of the thin film (thermally cured layer) was about 420 nm. The Ra of the surface of the film was 2 nm or lower which was lower than the Ra (20 nm) of the surface of the silver electrode.

An upper electrode was formed in the same manner as in Example 1 to evaluate its dielectric properties and insulating properties. Its dielectric constant was stable at a measurement range of 10 to 20 kHz and about 4.0 at 1 kHz. The obtained thin film showed high insulating properties at a voltage of 0 to 20 V.

Example 8

The thermosetting resin composition 5 was applied to the glass substrate 1 having an ITO electrode by spin casting and heated at 180° C. in a hot air circulating oven for 1 hour to form a thermally cured layer of the organic resin. The thickness of the thin film (thermally cured layer) was about 450 nm. The Ra of the surface of the film was 2 nm which was lower than the Ra (7 nm) of the ITO film.

An upper electrode was formed in the same manner as in Example 1 to evaluate its dielectric properties and insulating properties. Its dielectric constant was stable at a measurement range of 10 to 20 kHz and about 4.3 at 1 kHz. The obtained thin film showed high insulating properties at a voltage of 0 to 20 V.

Example 9

The FET shown in FIG. 1 was manufactured.

An organic semiconductor layer made of poly(3-hexylthiophene) having a repeating unit represented by the following formula (2) was used as the organic semiconductor layer.

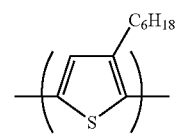

(2)

The gate electrode 2 on the surface of the substrate 1 was made of ITO, and the above glass substrates 1 having an ITO electrode was used.

Subsequently, a thin film was formed from the thermosetting resin composition 1 on this gate electrode 2 in the same manner as in Example 1. That is, the gate insulating layer 3 having a thickness of about 250 nm which was a cured product of phenolic novolac resin and hexamethoxymethyl melamine-based crosslinking agent was formed.

The source electrode 4 and the drain electrode 5 were formed by vacuum vapor deposition using a metallized mask. The electrode material was gold. The ultimate vacuum during deposition was $3 \times 10^{-5}$ Pa. The temperature of the substrate was set to room temperature. The distance L between the source electrode and the drain electrode was 50 μm, and the length W of the source and drain electrodes was 30 mm. The thickness of the metallized film was 100 nm.

Further, a 1% chloroform solution of poly(3-hexylthiophene) was dropped on the top surfaces of the source electrode 4, the drain electrode 5, and the gate insulating layer 3 and dried at 100° C. to form the organic semiconductor layer 6. Commercially available regioregular poly(3-hexylthiophene) powders purified by re-precipitation and manufactured by Aldrich Co., Ltd. were used as a raw material. An FET was obtained as described above.

Figure 3:
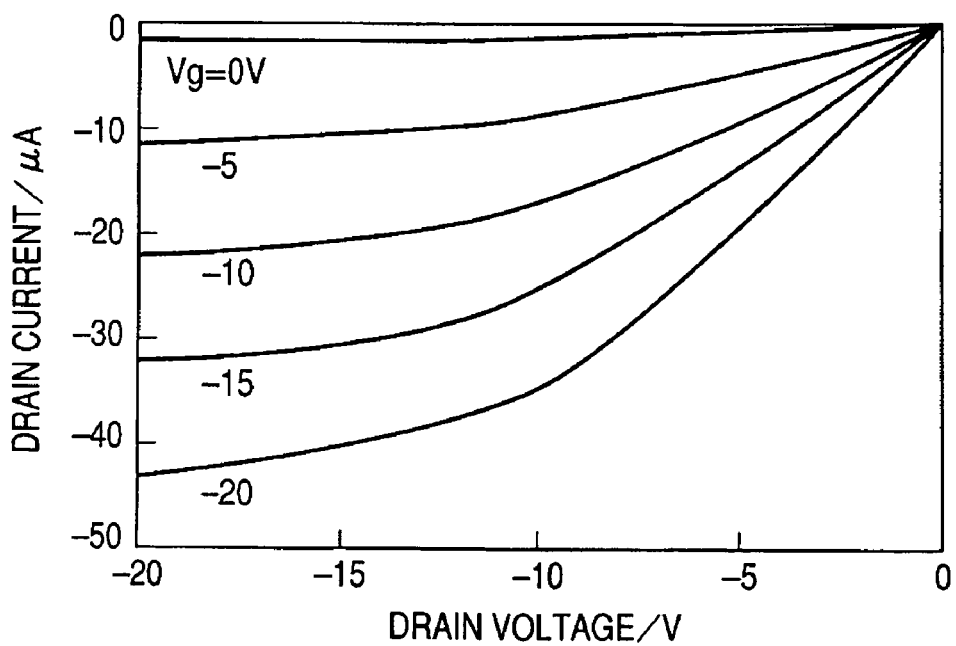
FIG. 3 is a diagram showing the electric properties of the FET of Example 8 of the present invention.

When the Vd-Id curve of the obtained FET was measured with a parameter analyzer (manufactured by Agilent Co., Ltd., trade name of 4156C). The evaluation results are shown in FIG. 3. According to FIG. 3, the FET of Example 9 showed switching properties that a drain current value (Id) running through the source electrode, organic semiconductor, and drain electrode was changed by a variation in gate voltage (Vg). This FET attained an Id ON-OFF ratio of 50 at a Vg of −20V.

Example 10

A 1% chloroform solution of a tetrabicycloporphyrin copper complex represented by the following formula (3) was applied to the glass substrate 1 having an ITO electrode by spin coating and baked at 220° C. to form a tetrabenzoporphyrin copper complex film represented by the formula (4). An FET was manufactured in the same manner as in Example 9 except that this tetrabenzoporphyrin copper complex film was used as an organic semiconductor layer.

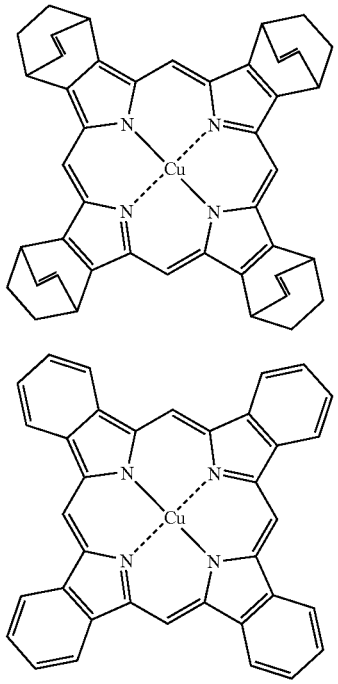

(3)

(4)

When the Vd-Id curve of the obtained FET was measured with a parameter analyzer (manufactured by Agilent Co., Ltd., trade name of 4156C), the FET of this example showed switching properties that a drain current value (Id) running through the source electrode, organic semiconductor and drain electrode was changed by a variation in gate voltage (Vg). This FET attained an Id ON-OFF ratio of 500 at a Vg of −20V.

Example 11

An FET was manufactured in the same manner as in Example 10 except that the substrate was changed to the above glass substrate 2 having a silver electrode. The substrate 1 was made of PET and the gate electrode 2 was made of silver.

When the Vd-Id curve of the obtained FET was measured with a parameter analyzer (manufactured by Agilent Co., Ltd., trade name of 4156C), the FET of this example showed switching properties that a drain current value (Id) running through the source electrode, organic semiconductor and drain electrode was changed by a variation in gate voltage (Vg). This FET attained an Id ON-OFF ratio of 400 at a Vg of −20V.

Comparative Example 1

12 g of polyvinyl phenol (manufactured by Maruzen Petrochemical Co., Ltd., trade name of S-1P) was dissolved in 88 g of PGMEA completely at room temperature to prepare a resin solution.

The obtained resin solution was applied to a PET film having an ITO electrode by spin coating and heated at 180° C. on a hot plate for 30 minutes to obtain a thin film. The thickness of the thin film at this point was about 300 nm. When the surface of the thin film was observed through AFM, the unevenness of the surface was about 8 nm which was lower than the unevenness (30 nm) of the surface of the ITO electrode. However, a big change was not seen.

The evaluation result of the insulating properties of an upper electrode which was formed in the same manner as in Example 1 is shown in FIG. 2. Since a dielectric breakdown occurred at 20 to 30 V in the thin film, the thin film did not function as an insulating layer.

INDUSTRIAL APPLICABILITY

Since the FET of the present invention rarely experiences a current leak from the gate electrode to the source electrode or the drain electrode and shows high mobility without increasing drive voltage, it can be used in circuits including a plastic substrate, display drive circuits for electronic tags and displays, and memories.

This application claims priority from Japanese Patent Application No. 2004-176130 filed Jun. 14, 2004, which are hereby incorporated by reference herein.

The invention claimed is:

1. A field effect transistor comprising at least a substrate, an organic semiconductor layer, an insulating layer, and a conductive layer, wherein the insulating layer comprises a cured product of a phenol resin represented by a following general formula (1):

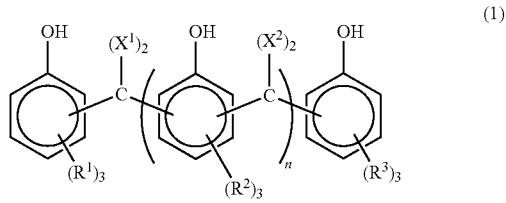

(1)

wherein, $R^1$, $R^2$ and $R^3$ are each independently at least one selected from the group consisting of hydrogen atom, halogen atom, hydroxymethyl group, alkyl group having 1 to 12 carbon atoms, alkenyl group, alkinyl group, alkoxyl group, alkylthio group, and alkyl ester group, $X^1$ and $x^2$ are each independently at least one selected from the group consisting of hydrogen atom, alkyl group having 1 to 12 carbon atoms, alkenyl group, alkinyl group, and aryl group, and n is an integer of 0 to 2,000.

2. The field effect transistor according to claim 1, wherein the conductive layer comprises a gate electrode, a source electrode, and a drain electrode, the insulating layer includes a gate insulating layer, and the gate insulating layer is a cured product of a phenol resin represented by the above general formula (1).

3. The field effect transistor according to claim 2, wherein the thickness of the gate insulating layer is 100 nm to 1 μm.

4. The field effect transistor according to any one of claims 1 to 3, wherein part or all of the conducive layer comprises an agglomerate of conductive fine particles having a primary particle diameter of 5 nm to 2 μm.

5. A process for producing a field effect transistor comprising a substrate, an organic semiconductor layer, an insulating layer, and a conductive layer, the process comprising the steps of:

coating a thermosetting resin composition containing at least a phenol resin represented by the following general formula (1):

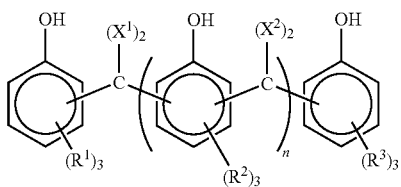

(1)

wherein, $R^1$, $R^2$ and $R^3$ are each independently at least one selected from the group consisting of hydrogen atom, halogen atom, hydroxymethyl group, alkyl group having 1 to 12 carbon atoms, alkenyl group, alkinyl group, alkoxyl group, alkylthio group, and alkyl ester group, $X^1$ and $X^2$ are each independently at least one selected from the group consisting of hydrogen atom, alkyl group having 1 to 12 carbon atoms, alkenyl group, alkinyl group, and aryl group, and n is an integer of 0 to 2,000; and heating the thermosetting resin to form the insulating layer.

6. The process for producing a field effect transistor according to claim 5, wherein part or all of the conductive layer is formed by applying a solution, dispersion, or paste of a conductive material or a precursor of the conductive material and heating it.

7. The process for producing a field effect transistor according to claim 5, wherein the softening point of the phenol resin contained in the thermosetting resin composition is in the range of 70 to 130° C.

* * * * *